United States Patent
Woodward

(10) Patent No.: US 6,482,671 B2
(45) Date of Patent: Nov. 19, 2002

(54) INTEGRATED OPTOELECTRONIC DEVICE WITH AN AVALANCHE PHOTODETECTOR AND METHOD OF MAKING THE SAME USING COMMERCIAL CMOS PROCESSES

(75) Inventor: Ted Kirk Woodward, Holmdel, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/792,939

(22) Filed: Feb. 26, 2001

(65) Prior Publication Data

US 2001/0017786 A1 Aug. 30, 2001

Related U.S. Application Data

(62) Division of application No. 09/375,583, filed on Aug. 17, 1999.

(51) Int. Cl.$^7$ .............................................. H01L 21/00
(52) U.S. Cl. ........................................ 438/91; 257/186
(58) Field of Search ............................ 438/22, 48, 91; 757/186, 187

(56) References Cited

U.S. PATENT DOCUMENTS

| | | | | |
|---|---|---|---|---|
| 4,949,144 A | * | 8/1990 | Kuroda et al. | 357/30 |
| 5,001,335 A | * | 3/1991 | Takaoka et al. | 250/211 J |
| 5,132,747 A | * | 7/1992 | Matsushima et al. | 357/13 |
| 5,179,430 A | * | 1/1993 | Torikai | 257/186 |
| 5,880,489 A | * | 3/1999 | Funaba et al. | 257/184 |
| 5,880,490 A | | 3/1999 | Antich et al. | 257/186 |
| 5,892,220 A | | 4/1999 | Woodward | 250/214 |

* cited by examiner

Primary Examiner—David Nelms
Assistant Examiner—Quoc Huang
(74) Attorney, Agent, or Firm—Cohen, Pontani, Lieberman & Pavane

(57) ABSTRACT

An integrated optoelectronic circuit chip for optical data communication systems includes a silicon substrate, at least one MOS field effect transistor (MOSFET) formed on a portion of the silicon substrate, and an avalanche photodetector operatively responsive to an incident optical signal and formed on another portion of the substrate. The avalanche photodetector includes a light absorbing region extending from a top surface of the silicon substrate to a depth h and doped to a first conductivity type. The light absorbing region is ionizable by the incident optical signal to form freed charge carriers in the light absorbing region. A light responsive region is formed in the light absorbing region and extends from the top surface of the silicon substrate to a depth of less than h. The light responsive region is doped to a second conductivity type of opposite polarity to the first conductivity type. The light absorbing region and the light responsive region form a P-N junction at the interface therebetween such that when the light absorbing and light responsive regions are appropriately reverse biased, the freed charge carriers in the light absorbing region are amplified by avalanche multiplication.

5 Claims, 2 Drawing Sheets

INTEGRATED OPTOELECTRONIC DEVICE WITH AN AVALANCHE PHOTODETECTOR AND METHOD OF MAKING THE SAME USING COMMERCIAL CMOS PROCESSES

CROSS-REFERENCE TO RELATED APPLICATION(S)

This application is a Divisional of U.S. patent application Ser. No. 09/375,583, filed, Aug. 17, 1999.

BACKGROUND OF THE INVENTION

1. Field of the Invention

The present invention relates to optoelectronic devices and, in particular, to a silicon-based integrated optoelectronic circuit chip having an avalanche photodetector and a method of making the chip using CMOS compatible processes.

2. Description of the Related Art

A number of difficulties have been encountered in the development of integrated solid-state photodetectors, i.e. photodetectors that are built or integrated on the same silicon wafer or chip as that of its associated electronic circuitry. Resolution of the problems requires the developer to optimize myriad parameters involving the properties of optical communication systems (e.g. operating wavelengths), fundamental optical properties of silicon (e.g. the band gap energy of Si and thus its wavelength absorption), and properties of other co-fabricated devices (e.g. P-type field effect transistor (PFET) or N-type field effect transistor (NFET)) which are to be simultaneously fabricated with the photodetector on the same chip. The problems are far more acute in the field of optical data communications because the speed and sensitivity of the photodetectors can significantly affect the performance of the communication systems.

It is known that for fast photodetection, photons should be collected rapidly. This is readily achieved by absorbing them in a region where the optically generated carriers (i.e. electrons and holes) can be collected by an electric field to form a photocurrent. Furthermore, it is known that the lowest cost, highest volume microelectronics process available is the Complementary Metal Oxide Silicon (CMOS) process, thus making it a desirable process for co-fabricating a photodetector. In CMOS, process depths are typically shallow (e.g. 3 microns or less), and get shallower as process line-widths shrink. Owing to the optical properties of silicon, the absorption depth for the most popular local area communications wavelengths (800–850 nm) exceeds this depth by a considerable margin. a Therefore, a significant portion of the photogenerated carriers would be created outside any depletion region. As a result, a photocurrent is produced only when these photogenerated carriers diffuse into the depletion region. Since the diffusion process is driven by random motion of the carriers, it is a relatively slow transport mechanism, thereby rendering integrated silicon-based photodetectors made in CMOS process impractical for application in high-speed data communication systems.

Another problem with silicon-based integrated photodetectors is that their manufacturing process must be compatible with that of devices such, for example, as PFETs and NFETs which are co-fabricated on the same silicon chip. For example, one prior art technique produces a photodetector beneath a relatively thick stack of dielectric layers whose combined thickness cannot be controlled to the level required for anti-reflection coatings. As a result, such photodetectors have low sensitivity or responsivity, i.e. low gain, and their outputs suffer about 3 dB potential variability in sensitivity from the ideal value. To improve responsivity of these photodetectors, one must accordingly either overcoat the photodetectors with an optimizing film or remove all of the overlying dielectric layers and then directly apply an anti-reflection coating thereon. Such additional processing steps, however, undesirably increase the complexity and cost of fabrication.

Another known technique requires selective epitaxial growth and multiple growth runs to integrate photodetectors made of III-V compound materials. Still another approach requires the fabrication of III-V LED layers on a silicon substrate and thereafter uses the silicon it substrate to create photodetectors. A problem with these approaches is that there exists large lattice mismatch between the II-V epitaxial layers and the silicon substrate; such a defect degrades the response of such photodetectors. Although acceptable for monitoring applications, such photodetectors do not meet the stringent requirements of optical data communication systems that operate at data rates of 200 Mbits per second or more.

There is accordingly a long felt need for a low-cost, fully-integrated photodetector that has low noise, can be operated at a low bit error rate, and exhibits high speed and high sensitivity.

SUMMARY OF THE INVENTION

An object of the present invention is to provide a low-cost integrated optoelectronic circuit chip having an avalanche photodetector that exhibits low-noise, highspeed response and high-sensitivity characteristics.

According to one aspect of the present invention, the inventive integrated avalanche photodetector (APD) is capable of being realized in concert with CMOS electronics, and can be fabricated in the same substrate using bulk CMOS-compatible processes. An advantage of such a photodetector is that it is inexpensive to manufacture and avoids the added U complexity and parasitic electronic effects associated with packaging silicon-based receiver circuits with detectors made of different or separate materials.

According to another aspect of the invention, the integrated avalanche photodetector is fabricated together with PFETs and NFETs on the same silicon substrate.

According to still another aspect of the present invention, the integrated avalanche photodetector includes an isolating region for isolating its active regions from the photogenerated charge carriers from the silicon substrate.

An avalanche photodetector operates by a mechanism known as avalanche multiplication. The avalanche multiplication mechanism involves impact ionization of lattice atoms by charge carriers, i.e. electrons and/or holes, freed by the absorption of optical energy. These freed charge carriers, when they drift into a region having a sufficiently high electric field, are imparted with kinetic energy appropriate to initiate the avalanche multiplication process, which is a mechanism for breakdown in P-N junction diodes. The highly energetic charge carriers then collide with and ionize the other atoms in the lattice, to thereby free more charge carriers which in turn collide with many other atoms in the lattice to yield still more freed carriers. In this manner, an avalanche photodetector can detect a weak optical signal and yet output in response a much larger photogenerated current (i.e. photocurrent) within a very short time. Since the amplification of charge carriers is internal to the photodetector, the avalanche photodetector has low noise characteristics as compared to one that requires external amplifiers. Further explanation of the avalanche multiplication mechanism may be found at pp. 98–108 of S. M. Sze, "Physics of Semiconductor Devices," John Wiley & Sons (1981), which is incorporated herein in its entirety.

In a currently preferred embodiment, an integrated optoelectronic circuit chip for optical data communication systems includes at least one MOS transistor formed on a portion of a silicon substrate, and an avalanche photodetector (APD) formed on another portion of the silicon substrate. The chip includes a light absorbing region extending from a top surface of the silicon substrate to a depth h and doped to a first conductivity type. The light absorbing region is capable of being ionized by the incident optical signal to form freed charge carriers. A light responsive region is formed in the light absorbing region and extends from the top surface of the silicon substrate to a depth less than h. The light responsive region is doped to a second conductivity type of opposite polarity to the first conductivity type, such that the light absorbing region and light responsive region form a P-N junction at the interface between the light absorbing region and light responsive region so that when the light absorbing region and the light responsive region are reverse biased to near the breakdown voltage, the freed charge carriers in the light absorbing region ionized by the incident optical signal are amplified by avalanche multiplication. The APD further includes a guard ring extending circumferentially along an edge of the light responsive region and configured for preventing premature breakdown of the APD.

The inventive method of fabricating an integrated optoelectronic circuit chip includes the steps of:

(a) providing a silicon substrate;

(b) forming at least one MOS field effect transistor on one portion of the silicon substrate using a CMOS compatible process; and (c) forming an avalanche photodetector on another portion of the silicon substrate using the CMOS compatible process by:

(i) doping the another portion of the silicon substrate with a dopant of a first conductivity type so as to form a light absorbing region having a depth h, and of the first conductivity type;

(ii) doping a portion of the light absorbing region with a dopant of a second conductivity type which is of opposite polarity to the first conductivity type to a depth $h_2$ less than h, so as to form a light responsive region of the second conductivity type and having a height $h_2$, to thereby define a P-N junction at an interface between the light absorbing region and the light responsive region; and (iii) forming a guard ring circumferentially along an edge of the light responsive region for preventing premature breakdown of the photodetector when the light absorbing region and the light responsive region are reverse biased to create avalanche multiplication conditions.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
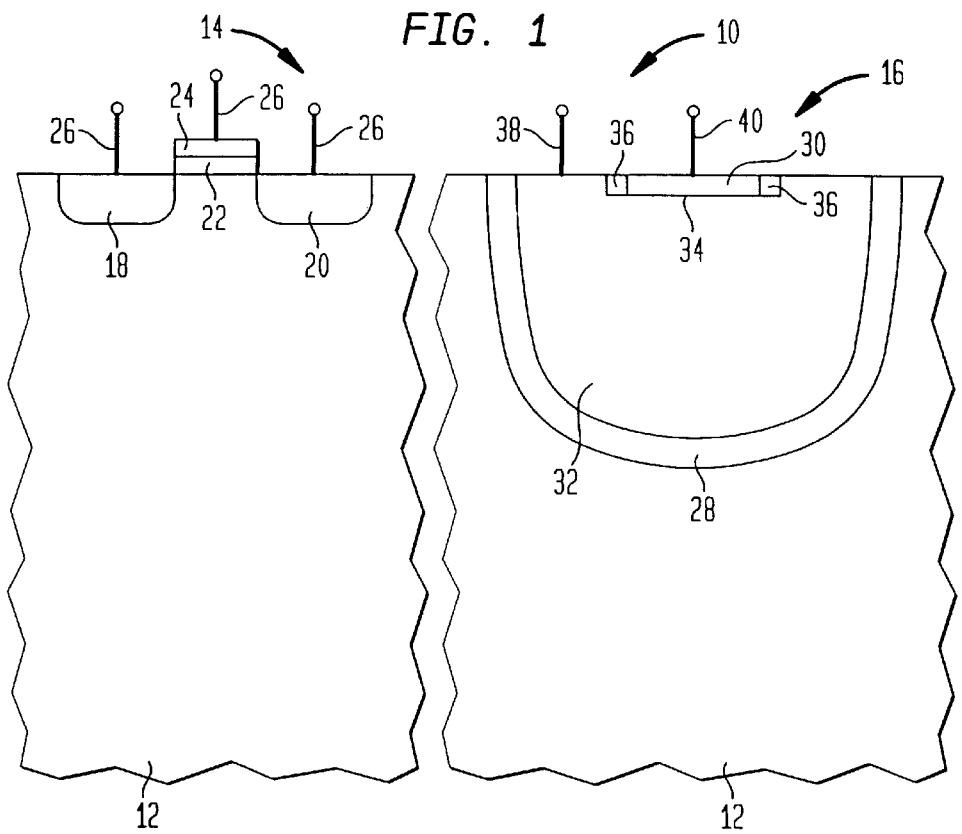
FIG. 1 is a cross-sectional view of one embodiment of the integrated optoelectronic circuit chip of the present invention.

Referring now to the drawings, FIG. 1 illustrates a cross sectional view of an embodiment of an integrated optoelectronic circuit chip 10 of the present invention, and which is manufactured using complementary metal-oxide-silicon (CMOS) processes or other CMOS compatible processes such, for example, as BiCMOS or bipolar processes on a silicon substrate 12. The chip 10 includes at least one metal-oxide semiconductor field effect transistor (MOSFET) 14 and an avalanche photodetector (APD) 16.

As depicted, the MOSFET 14 includes a source region 18 and a drain region 20 diffused or implanted into a region of the substrate 12 that is doped to a conductivity type opposite that of the source and drain regions 18, 20. The MOSFET 14 further includes an oxide layer 22 extending between or spanning the source and drain regions 18, 20, and a metal gate 24 disposed on the oxide layer 22. Electrodes 26 are provided on the source and drain regions 18, 20 and the metal gate 24 for connection with appropriate input/output lines. The MOSFET 14 may, for example, be a P-type field effect transistor ("PFET") in which the source and drain regions 18, 20 are P-type regions and the substrate or the region surrounding the P-type regions is doped with an N-type dopant. Alternatively, the MOSFET 14 may be an N-type field effect transistor ("NFET") wherein the source and drain regions 18, 20 are N-type regions and the substrate or the region surrounding the N-type regions is doped with a P-type dopant. The PFET or NFET may form a portion of an opto-receiver unit (not shown) that includes the APD 16. Many other art-recognized constructions for the MOSFET 14 are possible and are not described herein as they can be readily developed and fabricated by persons of ordinary skill in the art based on the present disclosure.

The APD 16 preferably includes an isolating region 28 for isolating the APD—specifically, the charge carriers which are freed by the photons absorbed by the silicon substrate—from the silicon substrate 12. As was discussed above, due to the band gap of silicon, the silicon substrate 12 will absorb incident light having a wavelength of about 1.1 µm or less. In any event, the isolating region 28 is configured to surround active regions of the APD 16 and to screen, trap or block the substrate-originated charge carriers from entering into and interfering with the active regions of APD 16. The isolating region 28 may be fabricated using techniques such as silicon-on-insulator or silicon-on-oxide. Alternatively, the region 28 may be formed by a buried P-N junction or doped to a desired conductivity type, as described below.

The active regions of the APD 16 include a light responsive region 30 and a light absorbing region 32 arranged to form a P-N junction 34 for generating a photocurrent. The light absorbing region 32 is doped to a first conductivity type and the light responsive region 30 is doped to a second conductivity type that is of opposite polarity to the first conductivity type. Preferably, the light responsive region is a heavily doped region relative to the light absorbing region.

Depending on the particular selection of the conductivity types for regions 30, 32, the avalanche multiplication may either be electron-initiated or hole-initiated. It has been discovered, however, electron-initiated avalanche multiplication is more preferable because the resulting APD produces less noise. Nonetheless, for electron-initiated avalanche multiplication, the light absorbing region 32 should be doped with a P-type dopant (e.g. B), and the light responsive region 34, with an N-type dopant (e.g. P, or As). If, on the other hand, hole-initiated avalanche multiplication is desired, then the light absorbing region 32 should be doped with an N-type dopant and the light responsive region 34 should be doped with a P-type dopant.

The APD 16 also includes a guard ring 36 that extends along the circumferential edge of the light responsive region 30 and that is configured for preventing field breakdown of device 16. Preferably, the guard ring 36 is defined by a region that is lightly doped with the same dopant as that of the light responsive region 30 so as to lower the electric field generated at the edge of the light responsive region 30 for a given diode reverse voltage, thereby preventing premature breakdown of the device.

The APD 16 further includes a first electrode 38 connected to the light responsive region 30 and a second electrode 40 connected to the light absorbing region 32. The first and second electrodes 38, 40 may, for example, be ohmic contacts. First and second electrodes 38, 40 are then reverse biased by a voltage source to a sufficiently large voltage appropriate to create electric fields near the breakdown field of the diode and thereby the conditions for avalanche multiplication of charge carriers. In a typical modem CMOS process, this voltage may, for example, be near 10 V, but its actual value will depend on the dopant levels in the light responsive and light absorbing regions 30, 32. When an optical signal of suitable wavelength is incident on the light responsive region, avalanche multiplication of optically generated carriers (by way of impact ionization) occurs in a region around the P-N junction, i.e. the transition region or depletion layer disposed substantially immediately below the light responsive region 30.

Figure 2:
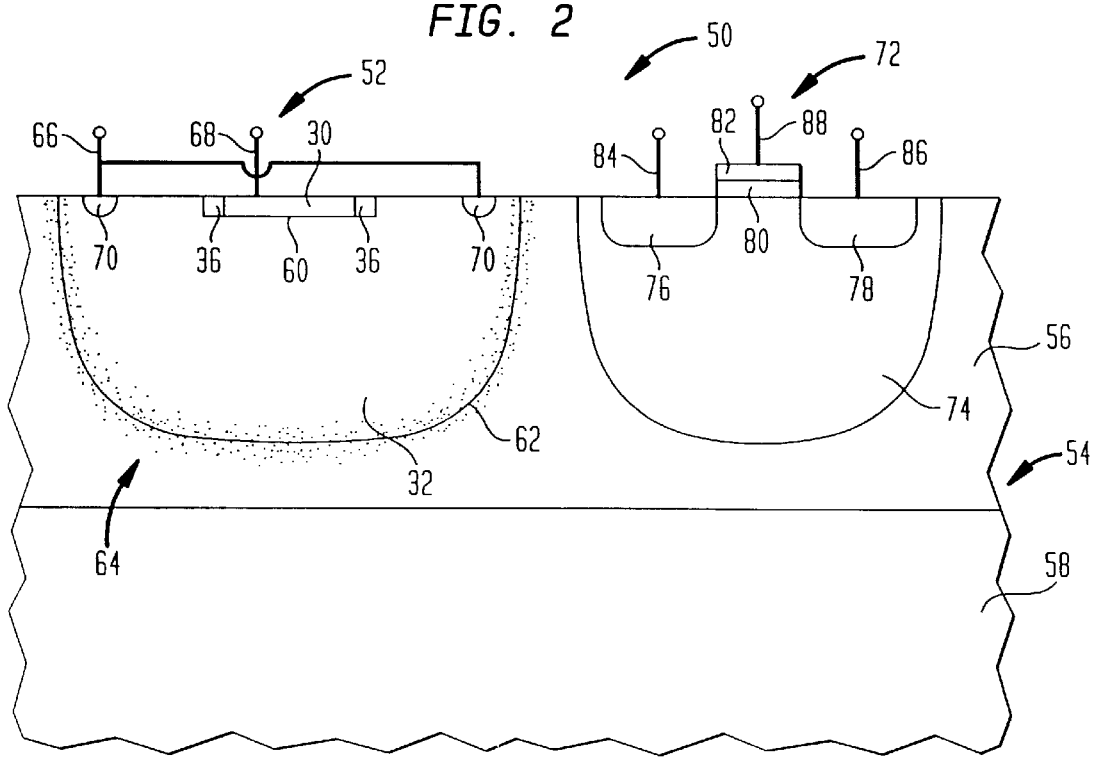
FIG. 2 a cross-sectional view of another embodiment of the integrated optoelectronic circuit chip of the present invention.

Another embodiment in accordance with the invention of an integrated optoelectronic circuit chip 50 with an electron-initiated avalanche photodetector 52 is illustrated in FIG. 2. As shown, the APD 52 is fabricated on an N-type substrate 54 that preferably includes a lightly doped N-type (i.e. $N^-$) epitaxial or "epi" layer 56 grown on an N-type silicon wafer 58. In this embodiment, the light responsive region 30 is a heavily doped $N^+$ region and the light absorbing region 32 is a P-type region or P "tub" so as to create a $P-N^+$ junction 60. A buried P-N junction 62 is formed at the interface between the P-type light absorbing region 32 and the $N^-$ epi layer 56. The guard ring 36 is formed of a lightly doped N-type region extending along the circumferential edge of the heavily doped $N^+$ light responsive region 30.

In an exemplary fine line CMOS process, the heavily doped $N^+$ region may include, for example, As at a concentration of about $1 \times 10^{19}$ cm$^3$. The heavily doped $N^+$ region has a depth of about 2000 Angstrom and the P tub has a depth of about 2 to 3 $\mu$m.

Performance of the APD 52 may be enhanced if the P-type dopant in the P tub is graded such that the dopant concentration is highest at or near the $P-N^+$ junction 60 and decreases toward the bulk of the substrate 54. A graded P tub, relative to a P tub having a uniform dopant concentration, is more advantageous because it: (1) creates a localized region of higher electric field in the more heavily doped regions that are more suitable for avalanche multiplication, and (2) can increase the depletion width, and thus the speed of response of APD 52.

In this embodiment, the isolating region 28 is formed by a depletion layer 64 effected by the buried $P-N^-$ junction 62. Freed charge carriers from the epi layer 24 and wafer 54 will migrate to the depletion layer 64 and be collected by the $P-N^-$ junction 62, thereby screening the active junction 60 (and in particular the active terminal 68) from the effects of these carriers.

The APD 52 further includes a P-side electrode 66 connected to the P tub and an N-side electrode 68 connected to the $N^+$ region. Preferably, the P tub includes a heavily doped $P^+$ contact region 70 for enhanced connection with the P-side electrode 66. The contact region 70 may be configured to extend circumferentially about and at a radial distance from the $N^+$ region.

Also shown in FIG. 2 is a P-type MOSFET (or PFET) 72 fabricated adjacent to APD 52. The PFET 72 is fabricated in an N tub 74 and includes a $P^+$ source region 76, a $P^+$ drain region 78, an oxide layer 80, and a metal gate 82. The PFET 72 also includes a source electrode 84 connected to the source region 76, a drain electrode 86 connected to the drain region 78, and a gate electrode 88 connected to the metal gate 82.

In operation, when the P-side electrode and the N-side electrode are reverse biased to near the breakdown voltage of the $P-N^+$ junction 60. An optical signal having a wavelength of less than about 1.1 $\mu$m is incident on the light responsive region 30. Light absorbed in the P tub results in electron-hole pairs, which are separated from one another by the electric field in the depletion region of the junction 60. Electrons are accelerated toward a region of higher electric field, and initiate an avalanche multiplication process, resulting in amplification of the absorbed optical signal.

The embodiment of FIG. 2 is fabricated using CMOS compatible processes; the steps of the fabrication process are as follows. Starting with an N-type silicon wafer 58, an epitaxial layer 56 is grown on wafer 58. Once formed, the epitaxial layer 56 is lightly doped with an N-type dopant. The light absorbing region 32 of the APD 52 is then formed in the epitaxial layer 56 by selectively doping (e.g. ion implantation) the region with a P-type dopant so as to create a graded P tub. The N tub 74 for the PFET 66 is also created in the epitaxial layer 56 by doping a region adjacent to the APD 52 with a P-type dopant. Next, a surface of the P tub is selectively doped with an N-dopant to form a heavily doped $N^+$ region (i.e. the light responsive region) and a lightly doped N region (i.e. the guard ring) extending along the circumferential edge of light responsive region 30. A heavily doped $P^+$ region is then formed in the P tub to create a contact region 70 for the P-side electrode 66. Heavily doped $P^+$ regions are also formed in the N tub to create the source and drain regions 76, 78 for the PFET. The oxide layer 80 extending between or spanning the source and drain regions 76, 78 is deposited and a metal layer 82 is deposited on the oxide layer 80. Electrodes 66, 68 are defined by depositing ohmic contacts at the contact regions 70, the $N^-$ region of the APD and the source, drain and gate regions of the PFET 72.

Figure 3:
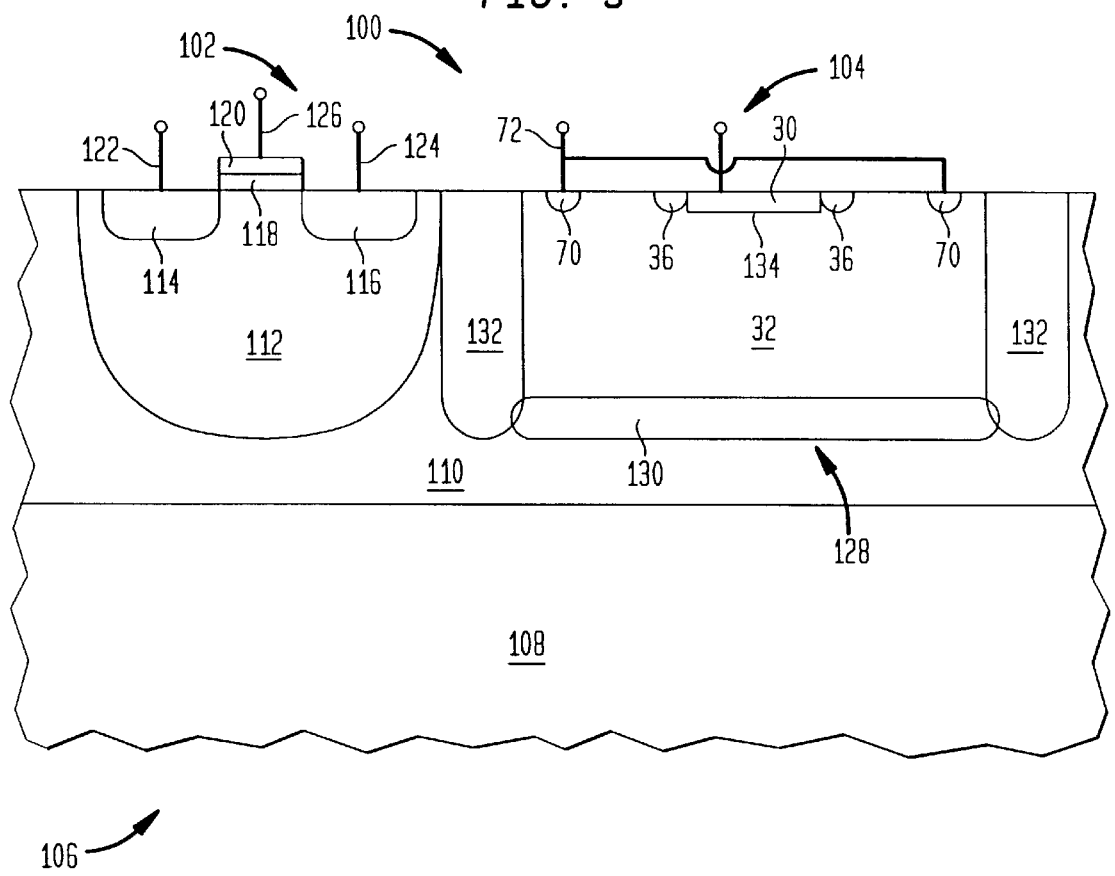
FIG. 3 is a cross-sectional view of still another embodiment of an integrated optoelectronic circuit chip constructed in accordance with the present invention.

FIG. 3 illustrates still another embodiment of the integrated optoelectronic circuit chip 100 of the present invention. As shown, the integrated optoelectronic circuit 100 includes an NFET 102 and an APD 104 fabricated on a silicon substrate 106 that includes a heavily doped P+-type silicon wafer 108 and a lightly doped P− epitaxial layer 110. The NFET 102 is fabricated in a P tub 112 formed in the P− epitaxial layer 110. The NFET 102 also includes a heavily doped N+ source region 114 and a heavily doped N+ drain region 116, an oxide layer 118 extending between the source and drain regions 114, 116, and a metal gate 120 disposed on the oxide layer 118. The NFET 102 further includes a source electrode 122, a drain electrode 124, and a gate electrode 126.

The APD 104 of FIG. 3, unlike that of the embodiment of FIG. 2, includes a doped isolating region 128. The isolating region 128 is configured to surround the active regions (i.e. light responsive region 30 and light absorbing region 32) of APD 104 and is doped to a conductivity type that is of opposite polarity to the conductivity type of light absorbing region 32. Isolating region 128, depicted in FIG. 3 as generally cup shaped, includes a bottom portion 130 and a side portion 132 that are doped with an N-type dopant.

In this embodiment, the light absorbing region 32 is doped with a P-type dopant and the light responsive region 30 is heavily doped with an N-type dopant to thereby form a P-N+ junction 134 at the interface between light responsive region 30 and light absorbing region 32. The P-type light absorbing region or P tub 32 is preferably graded such that dopant concentration is highest near the surface and decreases toward the bulk of the substrate. A guard ring 36, which is lightly doped with an N-type dopant, extends circumferentially along the edge of the heavily doped N+ light responsive region 30 for preventing field breakdown. The P tub preferably includes a heavily doped P+ contact region 70, disposed circumferentially about and at a spacing or distance from the light absorbing region, for enhanced connection with a P-side electrode.

The APD of this FIG. 3 embodiment, similar to that of the embodiment of FIG. 2, is also electron-initiated in that avalanche multiplication results primarily from the photogenerated electrons from the light absorbing layer.

This embodiment may also be fabricated using CMOS-compatible processes. First, epitaxial layer 110 is grown on the heavily doped P+ silicon substrate 108. The epitaxial layer 110 is lightly doped with a P-type dopant. Next, the epitaxial layer 110 is doped with a P-type dopant to form P tub 112. Epitaxial layer 110 is also doped with an N-type dopant to form a buried N-type region so as to create bottom portion 130 of isolating region 128. The side portion 132 of isolating portion 128 is formed by doping a region having a depth reaching the buried N region and extending along the circumferential edge of the buried N region with an N-type dopant. The region surrounded by the isolating region 128 is then doped with a P-type dopant to form light absorbing region 32. Preferably, art-recognized techniques are used to create a graded P tub having a higher dopant concentration near the surface of the substrate 106 and a relatively low dopant concentration toward the bulk of substrate 106.

The light responsive region 30 of APD 104 is formed by heavily doping a region in the light absorbing region 32 with an N-type dopant. Next, guard ring 36 is formed by lightly doping a region along the circumferential edge of light responsive region 30. The P+ contact region 70 for connecting the light absorbing region 32 to a P-side electrode 72 is formed by heavily doping, with a P-type dopant, an annular region dimensioned to surround the light responsive region 30.

To fabricate NFET 102, two adjacent regions in P tub 112 are heavily doped with an N-type dopant to form source and drain regions 114, 116. An oxide layer 118 is formed between the source and drain regions 114 and 116. A metal layer 120 is then deposited on the oxide layer 118 to form a gate. Finally, ohmic contacts 122, 124 are formed on the source and drain regions 114, 116 and metal layer 120.

Although the embodiments of FIGS. 2 and 3 include only electron-initiated APDs, persons of ordinary skill, based on the disclosure herein, can readily modify the conductivity types of the active regions of the APDs to obtain hole-initiated APDs. For example, the light responsive region 30 of the APD of FIG. 2 may instead be a heavily doped P+ region and the light absorbing region 32, an N-type region.

While there have shown and described and pointed out fundamental novel features of the invention as applied to preferred embodiments thereof, it will be understood that various omissions and substitutions and changes in the form and details of the methods described and devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

I claim:

1. A method of producing an integrated optoelectronic circuit, comprising the steps of:

(a) providing a silicon substrate;

(b) forming an MOS field effect transistor on one portion of the silicon substrate using a CMOS-compatible process; and (c) forming an avalanche photodetector on another portion of the silicon substrate using said CMOS-compatible process by:

(i) doping the another portion of the silicon substrate with a dopant of a first conductivity type so as to form a light absorbing region having a depth $h_1$ and of said first conductivity type;

(ii) doping a portion of said light absorbing region with a dopant of a second conductivity type of opposite polarity to the first conductivity type to a depth $h_2$ less than $h_1$ so as to form a light responsive region having said depth $h_2$ and of said second conductivity type, to thereby form a P-N junction at an interface defined between the light absorbing region and the light responsive region; and (iii) forming a guard ring circumferentially along an edge of the light responsive region for preventing premature breakdown of the photodetector when the light absorbing region and the light responsive region are reverse biased to thereby create a breakdown electric field.

2. The method of claim 1, further comprising the step of doping the silicon substrate with a dopant of the second conductivity type so as to form another P-N an interface defined between the light absorbing region and the silicon substrate for isolating the light absorbing region from charge carriers from the silicon substrate.

3. The method of claim 1, further comprising the step of forming on the substrate an isolating region for isolating the light absorbing region from charge carriers from the silicon substrate by doping a region surrounding the light absorbing region with a dopant of the second conductivity type.

4. The method of claim 1, wherein the dopant of the first conductivity type is a P-type do pant and the dopant of the second conductivity type is an N-type dopant.

5. The method of claim 1, wherein the dopant of the first conductivity type is an N-type dopant and the dopant of the second conductivity type is a P-type dopant.

* * * * *